United States Patent [19]
Takahashi et al.

[11] Patent Number: 5,766,972
[45] Date of Patent: Jun. 16, 1998

[54] METHOD OF MAKING RESIN ENCAPSULATED SEMICONDUCTOR DEVICE WITH BUMP ELECTRODES

[75] Inventors: Yoshiharu Takahashi; Jiro Oseto; Teru Hirata, all of Itami, Japan

[73] Assignee: Mitsubishi Denki Kabushiki Kaisha, Tokyo, Japan

[21] Appl. No.: 443,025

[22] Filed: May 17, 1995

Related U.S. Application Data

[62] Division of Ser. No. 252,777, Jun. 2, 1994, abandoned.

[51] Int. Cl.⁶ .................................................. H01L 21/56
[52] U.S. Cl. ...................... 438/127; 438/614; 264/272.17
[58] Field of Search ............................... 437/183, 212, 437/214, 216, 209; 257/700, 737; 264/272.17

[56] References Cited

U.S. PATENT DOCUMENTS

| | | | |
|---|---|---|---|
| 3,868,724 | 2/1975 | Perrino | 357/65 |
| 4,246,595 | 1/1981 | Noyori et al. | 357/70 |
| 4,573,067 | 2/1986 | Tuckerman et al. | 357/82 |
| 4,600,600 | 7/1986 | Pammer et al. | 437/183 |
| 4,721,996 | 1/1988 | Tanizawa | 357/80 |
| 5,071,787 | 12/1991 | Mori et al. | 437/183 |
| 5,135,890 | 8/1992 | Temple et al. | 437/216 |
| 5,138,145 | 8/1992 | Nakamura et al. | 437/212 |
| 5,139,969 | 8/1992 | Mori | 437/211 |
| 5,143,865 | 9/1992 | Hideshima et al. | 437/183 |
| 5,157,478 | 10/1992 | Ueda et al. | 357/72 |
| 5,179,039 | 1/1993 | Ishida et al. | 437/212 |
| 5,196,371 | 3/1993 | Kulesza et al. | 437/211 |
| 5,250,469 | 10/1993 | Tanaka et al. | 437/216 |
| 5,289,346 | 2/1994 | Carey et al. | 437/209 |
| 5,349,237 | 9/1994 | Sayka et al. | 257/15 |
| 5,468,681 | 11/1995 | Pasch | 437/216 |
| 5,496,435 | 3/1996 | Abbott | 437/212 |
| 5,496,775 | 3/1996 | Brooks | 437/214 |
| 5,518,957 | 5/1996 | Kim | 437/182 |
| 5,527,743 | 6/1996 | Variot | 437/212 |

FOREIGN PATENT DOCUMENTS

| | | | |
|---|---|---|---|
| 60-189957 | 9/1985 | Japan | 437/212 |
| 63-127541 | 5/1988 | Japan | 437/212 |
| 3-154344 | 7/1991 | Japan | 437/183 |

OTHER PUBLICATIONS

Pearson, "Integrated Circuit Chip Cooling", IBM Technical Bulletin, vol. 19, No. 2, Jul. 1976, pp. 460–461.

*Primary Examiner*—George Fourson
*Assistant Examiner*—Scott Kirkpatrick
*Attorney, Agent, or Firm*—Leydig, Voit & Mayer, Ltd.

[57] ABSTRACT

A semiconductor device includes a semiconductor chip attached to a lead frame with recesses on the rear surface of the semiconductor chip opposite the lead frame. These recesses increase the heat radiation area of the semiconductor chip. In a method of producing a semiconductor device, the height of a cavity between upper and lower dies is smaller than the height of the semiconductor chip including bump electrodes. During a molding process, the bump electrodes contact the upper die or a dam surrounding the bump electrodes so that no thin burrs are produced on the surfaces of the bump electrodes in the molding process.

7 Claims, 11 Drawing Sheets

METHOD OF MAKING RESIN ENCAPSULATED SEMICONDUCTOR DEVICE WITH BUMP ELECTRODES

This disclosure is a division of application Ser. No. 08/252,777, filed Jun. 2, 1994, now abandoned.

BACKGROUND OF THE INVENTION

1. Field of the Invention

The present invention relates to a semiconductor device and a production method thereof and, more particularly, to a semiconductor device having a bump electrode and a production method thereof.

2. Description of the Related Art

FIG. 23 is a cross-sectional view of a conventional semiconductor device. As shown in this figure, the semiconductor device comprises a semiconductor chip 1 including a silicon substrate. An electronic circuit is formed on one surface of the silicon substrate. Bumps 1a that serve as electrodes are formed in a peripheral area around the electronic circuit portion. The semiconductor chip 1 is attached to a die pad 2. The bumps 1a are electrically connected to inner leads 4a of a lead frame 4 via metal wires 3. The semiconductor chip 1, the die pad 2, metal wires 3, and the inner leads 4a of the lead frame 4 are encapsulated with a molding resin 5.

A semiconductor device having such a configuration described above may be produced as follows. First, a semiconductor chip is attached to a die pad 2 with a metal-based solder or a resin-based adhesive. Wire bonding is then performed so as to electrically connect bumps 1a to inner leads 4a of a lead frame 4 via metal wires 3 such as gold wires. These elements are enacapsulated with a molding resin 5 such as an epoxy resin, and thus a complete semiconductor device is obtained.

The size of the conventional semiconductor device described above, however, is considerably greater than that of the semiconductor chip 1, since the semiconductor chip 1 attached on the die pad 2 is encapsulated with the molding resin 5 together with the inner leads 4a connected to the semiconductor chip 1 via the metal wires 3. Therefore, to mount semiconductor devices of this type on a circuit board, a large area on the circuit board is required for each semiconductor device. This means that it is difficult to achieve high density mounting of semiconductor devices, and that it is impossible to meet the increasing requirement of miniaturization in various electronic systems. Furthermore, in the conventional type semiconductor device mounted on a circuit board via a lead frame 4, heat cycles give rise to thermal stress between the lead frame 4 and the circuit board due to the difference in thermal expansion between the lead frame 4 and the circuit board, which may result in damage in the connecting portion between the lead frame 4 and the circuit board. Thus, the conventional semiconductor device has a problem with electrical reliability.

Wireless bonding is known as another technique to attach a semiconductor device on a lead frame. In this technique, the surface of a semiconductor chip on which an electronic circuit portion or the like is formed is directed down (in a face-down fashion), and electrodes are directly connected to a lead frame. In this technique, a semiconductor chip can be attached on a lead frame more easily as compared to the technique of wire bonding, and thus this technique is suitable for automated production.

FIG. 24 is a cross-sectional view of a semiconductor device according to the conventional wireless bonding technique. FIG. 25 is a perspective view of a semiconductor chip used in this semiconductor device, wherein the figure illustrates the semiconductor chip seen to its back side. In this type of semiconductor device, the face of a semiconductor chip 1 is directed down, and the semiconductor chip 1 is heated so as to connect bumps 1a to inner leads 4a of a lead frame 4 whereby the semiconductor chip 1 is electrically and mechanically connected to the lead frame 4, and held on it. The semiconductor chip 1 is then encapsulated with a molding resin 5 into an integral form so that an electric circuit portion formed on the semiconductor chip 1 and other elements such as connections between the semiconductor chip and the lead frame 4 are isolated from the outside environment.

This type of semiconductor device operates as follows. When an electric signal is applied from the outside to the outer lead 4b, the signal is transmitted to the semiconductor chip 1 via the inner lead 4a and the bump 1a. Similarly, an electric signal generated inside of the semiconductor chip 1 is output to the outside via the bump 1a and the inner and outer leads 4a, 4b of the lead frame 4. During the operation, the electric circuit of the semiconductor chip 1 generates heat, which is radiated to the outside via the molding resin 5 and the lead frame 4.

In the conventional type of semiconductor device described above, however, since the semiconductor chip 1 is connected to the lead frame 4 only via the bumps 1a, only a small amount of heat can be radiated via the lead frame 4, and the heat removal from the semiconductor chip 1 to the outside is mainly via the molding resin with thermal conductivity less than that of the lead frame 4. As a result, there is a problem that this type of semiconductor device is poor in heat removal from the semiconductor chip 1 to the outside, which may result in an increase in temperature beyond the allowable maximum limit. Thus, this type of semiconductor device has problems regarding the reliability or the maintenance of its functions.

The conventional technique to produce the semiconductor device will be described in more detail below.

FIG. 26 is a cross-sectional view illustrating a production method of the conventional semiconductor device. As shown in FIG. 26, a semiconductor chip 1 having electrodes 6 and bumps 1a formed on the electrodes 6 (refer to FIG. 27) is placed into a cavity between an upper die 7 and a lower die 8, and then clamped by the upper and lower dies 7 and 8. The molding resin 5 is injected into the cavity and cured so as to encapsulated the semiconductor chip 1. The height $H_1$ of the cavity (refer to FIG. 26) is equal to the height $H_2$ of the semiconductor chip 1 as measured from the bottom to the top of the bump 1a (refer to FIG. 27). Theoretically, there is no gap between the bumps 1a and the upper die 7. In practice, however, there is often a gap g (refer to FIG. 26) arising from the variations in the size of the lower die 8 and the height of the bumps 1a. If there is a gap g, the molding resin 5 intrudes into the gap g when the molding resin 5 is injected. As a result, thin burrs 9 of the molding resin 5 are formed on the bumps 1a.

In the conventional method of producing a semiconductor device, as described above, since the height $H_1$ of the cavity formed between the upper and lower dies 7 and 8 is equal to the height $H_2$ of the bump 1a, errors in these heights lead to the formation of the thin burrs 9 of the molding resin 5 on the bumps 1a.

FIG. 29 is a cross-sectional view of another semiconductor device according to a conventional technique. The semiconductor device comprises only a semiconductor chip 1 which has a number of protruding bumps 1a on its upper surface, without encapsulation of the molding resin 5. In this type of semiconductor device, the semiconductor chip 1 is exposed to the outside without protection from the outside environment.

The semiconductor device of this type has a problem in that there is a possibility that the semiconductor chip 1 maybe damaged because there is no encapsulation by the molding resin 5 for protecting the semiconductor chip 1.

SUMMARY OF THE INVENTION

To solve the above problems, a first object of the present invention is to provide a small-sized semiconductor device whose size is nearly equal to the size of a semiconductor chip whereby it is possible to achieve a great increase in the mounting density, wherein the semiconductor device is insensitive to heat cycles and has high reliability.

A second object of the present invention is to provide a semiconductor device that can provide good heat removal from a semiconductor chip even in the case where the semiconductor chip is connected to a lead frame in a face-down fashion.

A third object of the present invention is to provide a method of producing a semiconductor device that produces no thin burrs on bumps during the molding process.

A fourth object of the present invention is to provide a method of producing a semiconductor device including encapsulating a semiconductor chip with a molding resin without embedding bumps in the molding resin and without damaging the semiconductor chip.

According to an aspect of the present invention, there is provided a semiconductor device comprising: a semiconductor chip having a plurality of first electrodes on a surface of the semiconductor chip; and an insulating tape comprising a plurality of second electrodes on a surface of the insulating tape at locations corresponding to the plurality of first electrodes of the semiconductor chip, a plurality of electrodes for external connections on the back surface of the insulating tape, and interconnections for electrically connecting the plurality of second electrodes and the plurality of electrodes for external connections; wherein the semiconductor chip is attached to the insulating tape such that the plurality of first electrodes are in electrical contact with the plurality of second electrodes.

According to another aspect of the present invention, there is provided a semiconductor device comprising: a semiconductor chip having a plurality of bumps on a surface of the semiconductor chip and a plurality of recesses on a the back surface of the semiconductor chip; and a lead frame for holding the semiconductor chip in a face-down fashion wherein the plurality of bumps are connected to inner leads of the lead frame.

According to still another aspect of the present invention, there is provided a method of producing a semiconductor device comprising: a first step in which a semiconductor chip having a bump is placed in a cavity between a plurality of dies, the height of the cavity being smaller than the height of the semiconductor chip including the bump, the upper surface of the bump being in contact with the inner face of the die; and a second step in which a molding resin is injected into the cavity and cured so as to encapsulate the semiconductor chip with the molding resin.

According to another aspect of the present invention, there is provided a method of producing a semiconductor device, with a semiconductor chip having a continuous dam in a peripheral area around a bump on the surface of the semiconductor chip placed in a cavity between a plurality of dies with a dam in contact with an inner face of a die and injecting a molding resin into the cavity and curing to encapsulate the semiconductor chip in the molding resin with the bump exposed to the outside.

According to still another aspect of the present invention, there is provided a method of producing a semiconductor device, with a semiconductor chip having a partial dam in a peripheral area around a bump on the surface of the semiconductor chip placed in a cavity between a plurality of dies with the bump and the dam in contact with an inner face of a die, and injecting a molding resin into the cavity and curing to encapsulate the semiconductor chip in the molding resin with the bump exposed to the outside.

According to another aspect of the present invention, there is provided a method of producing a semiconductor device, with a semiconductor chip having a partial dam in a peripheral area around a bump on the surface of the semiconductor chip placed in a cavity between a plurality of dies with the bump and the dam in contact with the inner face of the die, and injecting a molding resin is injected into the cavity and curing to encapsulate the semiconductor chip in the molding resin with the bump exposed to the outside, and finally an additional bump is formed on the top of the bump.

DETAILED DESCRIPTION OF THE PREFERRED EMBODIMENTS

EMBODIMENT 1

Figure 1A:
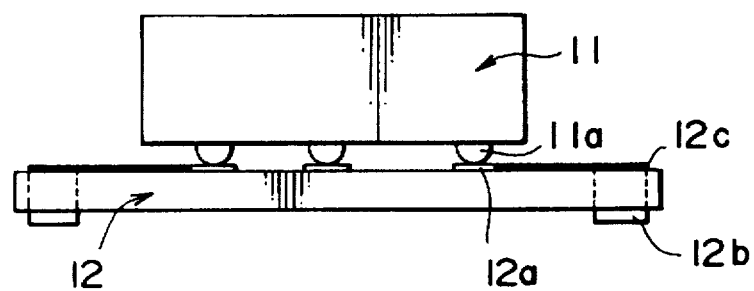
FIG. 1A is a side view of a first embodiment of a semiconductor device according to the present invention.
Figure 1B:
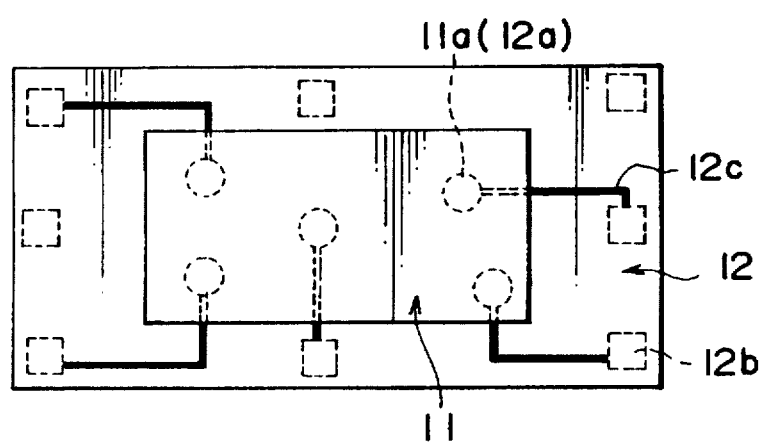
FIG. 1B is a plan view thereof.

FIG. 1A is a side view of a semiconductor device according to embodiment 1 of the present invention, and FIG. 1B is a plan view thereof.

As shown in FIGS. 1A and 1B, the semiconductor device comprises a semiconductor chip 11 and an insulating tape 12. There are provided a plurality of bumps 11a on a surface of the semiconductor chip 11, wherein the bumps serve as first electrodes. The insulating tape 12 is provided with electrodes 12a serving as second electrodes on the surface of the insulating tape at locations corresponding to the bumps 11a, electrodes 12b for external connections formed on the surface opposite the electrode 12a, that is, on the back surface of the insulating tape, and metal interconnections 12c electrically connecting electrodes 12a and 12b to one another. The bumps 11a are electrically connected corresponding to the electrodes 12a.

That is, as shown in FIGS. 1A and 1B, the bumps 11a are made up of metal protruding from the surface of the semiconductor chip 11 in electrode areas of the electronic circuit. The plurality of electrodes 12a are located on the surface of the insulating tape 12 at the locations corresponding to the locations of respective bumps 11a. At least one of the bumps 11a or the electrodes 12a are melted so as to electrically connect these electrodes to one another, by means of thermocompression bonding or ultrasonic bonding. The electrodes 12b for external connections extend through the insulating tape 12 from its front surface to the back surface, and they protrude from the back surface of the insulating tape 12. These electrodes 12b for external connections are connected to the electrodes 12a via the metal interconnections 12c on the surface of the insulating tape 12. The semiconductor device configured in this manner can be easily mounted on a circuit board by connecting the external connection electrodes 12b to the corresponding points on the circuit board.

In embodiment 1, as described above, since the semiconductor device has configuration in which the bumps 11a formed on the surface of the semiconductor chip 11 are electrically connected to the electrodes 12a on the front surface of the insulating tape 12, if the locations of the external connection electrodes 12b on the insulating tape 12 are designed appropriately, it is possible to reduce the total size of the semiconductor device to a size nearly equal to the size of the semiconductor chip 11. Therefore, it is possible to achieve a great reduction in the space required for the mounting of the semiconductor device, which means that it is possible to increase the mounting density.

Furthermore, in this embodiment 1, since the external connection electrodes 12b are located on the insulating tape 12, even if there is a difference in thermal expansion between the semiconductor device and the circuit board during heat cycles, thermal stress between the semiconductor device and the circuit board is relaxed by the insulating tape 12. Therefore, the connections between the semiconductor device and the circuit board can maintain high reliability in electric performance for a long term.

Furthermore, in this embodiment 1, it is possible to place the external connection electrodes 12b at desired arbitrary locations by modifying the pattern of the metal interconnections 12c. This means that it is possible to place the bumps 11a at arbitrary locations on the semiconductor chip 11 without being limited by the locations of the external connection electrodes 12b, and thus it is possible to standardize the locations of electrodes of semiconductor devices. As a result, it is also possible to improve the electrical characteristics of the semiconductor chip 11.

EMBODIMENT 2

Figure 2A:
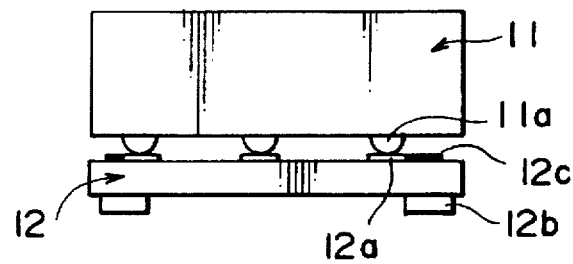
FIG. 2A is a side view of a second embodiment of a semiconductor device according to the present invention.
Figure 2B:
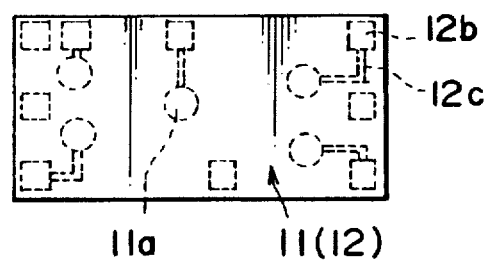
FIG. 2B is a plan view thereof.

FIG. 2A is a side view of a semiconductor device according to embodiment 2 of the present invention, and FIG. 2B is a plan view thereof.

In this embodiment 2, as shown in FIGS. 2A and 2B, a semiconductor device is configured in the same manner as that in embodiment 1 except that the area of an insulating tape 12 is nearly equal to the area of the semiconductor chip 11, and the external connection electrodes 12b are located in this area by modifying the pattern of the metal interconnections 12c. In addition to the advantages of embodiment 1, embodiment 2 the advantage that it is possible to further reduce the area required for the mounting of the semiconductor device, and thus it is possible to achieve a higher mounting density.

EMBODIMENT 3

Figure 3:
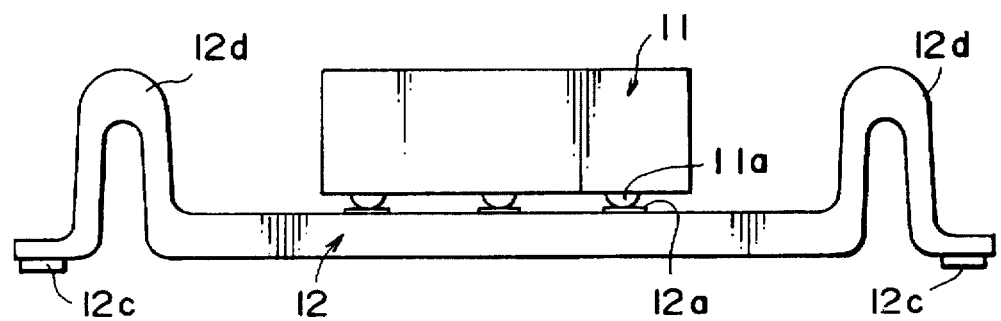
FIG. 3 is a side view of a third embodiment of a semiconductor device according to the present invention.

FIG. 3 is a side view of a semiconductor device according to embodiment 3 of the present invention. In embodiment 3, as shown in FIG. 3, the semiconductor device is configured in the same manner as in embodiment 1 or 2 except that an insulating tape 12 has an area larger than that of the semiconductor chip 11, the end portions of the insulating tape 12 are bent along the sides of the semiconductor chip 11 so as to form protrusions 12d, and the external connection electrodes are located in the end portions of the insulating tape 12. In addition to the advantages of embodiments 1 and 2, embodiment 3 has the advantage that the protrusions 12d of the insulating film 12 can further reduce thermal stress.

EMBODIMENT 4

Figure 4:
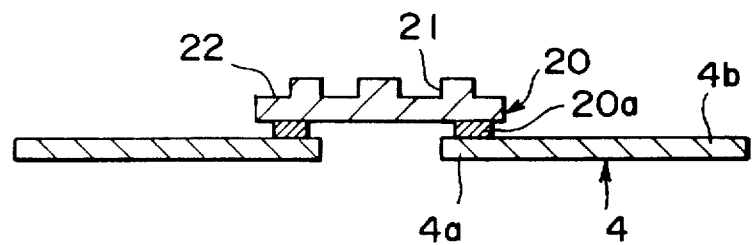
FIG. 4 is a cross-sectional view of a fourth embodiment of a semiconductor device according to the present invention.
Figure 5:
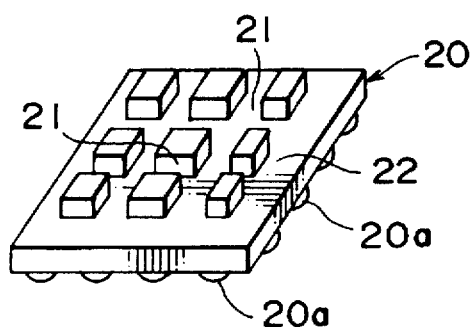
FIG. 5 is a perspective view of a semiconductor chip for use in the fourth embodiment of the semiconductor device according to the present invention, the semiconductor chip being seen from its back face.

FIG. 4 is a cross-sectional view of a semiconductor device according to embodiment 4. FIG. 5 is a perspective view of a semiconductor chip used in this semiconductor device, wherein the figure illustrates the semiconductor chip seen from its back side. In this embodiment, the semiconductor chip is connected to a lead frame via bumps in a face-down fashion by means of wireless bonding. As shown FIGS. 4 and 5, tessellated recesses or grooves 21 are formed lengthwise and crosswise on the back surface of the semiconductor chip 20 (the upside FIGS. 4 and 5). These recesses 21 may be formed, for example, by means of isotropic or anisotropic etching. There is also provided a step 22 in a peripheral area on the back surface of the semiconductor chip 20, wherein the step 22 is formed by a technique similar to that used to form the recesses 21. The plane of the step 22 and the bottom face of the recesses 21 are at the same level. The semiconductor chip 20 is attached on the lead frame 4a in a face-down fashion by connecting the bumps 20a to the inner leads 4a of the lead frame by means of thermo-compression bonding. In a semiconductor device according to embodiment 4, the semiconductor chip 20 is not encapsulated with a resin, and all of the semiconductor chip 20 is is exposed to the ambient atmosphere.

The operation of this type semiconductor device will be described below in connection with the roles of the recesses 21. An electric signal is input to the semiconductor chip 20 via the lead frame 4 and the bumps 20a. Similarly, an electric signal is output from the semiconductor chip 20 via the lead frame 4 and the bumps 20a. During operation, heat generation occurs due to the electric power supplied to the semiconductor chip 20. As a result, the temperature of the semiconductor chip 20 rises. Since the semiconductor chip 20 is connected to the lead frame having good thermal conductivity only via the bumps 20a, only a small amount of heat can be removed via the lead frame 4, and most heat generated in the semiconductor chip 20 is radiated to the ambient.

In the heat radiation, a great amount of heat can be radiated to the outside via the recesses 21 on the back surface of the semiconductor chip 20 because the thermal radiation area is increased by the recesses 21. Therefore, simple air cooling is good enough to effectively remove the heat generated in the semiconductor chip 20 to the outside, thereby suppressing the temperature rise of the semiconductor chip 20. This technique can provide improved heat removal even to a semiconductor device comprising a semiconductor chip 20 that is attached to a lead frame 4 in a face down fashion by means of wireless bonding, whereby it becomes possible to prevent the temperature from rising beyond the allowable maximum limit, and thus it is possible to prevent degradation in reliability or performance.

EMBODIMENT 5

Figure 6:
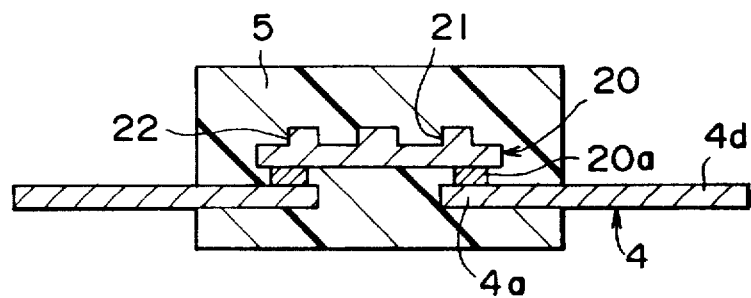
FIG. 6 is a cross-sectional view of a fifth embodiment of a semiconductor device according to the present invention.

FIG. 6 is a cross-sectional view of a semiconductor device according to embodiment 5 of the present invention. In this embodiment 5, the semiconductor device is configured in the same manner as in embodiment 4 except that a semiconductor chip 20 is encapsulated with a molding resin 5 whereby an electronic circuit portion of the semiconductor chip 20, connections between bumps 20a of the semiconductor chip 20 and inner leads 4a of a lead frame 4, and other elements are isolated from the environment. In this embodiment 5, since the semiconductor chip 20 is encapsulated with the molding resin 5, the semiconductor chip 20, the connections to the lead frame 4, and other elements are protected from being contaminated with dirt, moisture, etc., present in the environment, and also protected from being damaged. Due to the recesses 21 and the step 22 formed on the back surface of the semiconductor chip 20, the contact area between the semiconductor chip 20 and the molding resin 20, and irregularities between them are increased, whereby the adhesion between the semiconductor chip 20 and the molding resin 5 is improved. Furthermore, since the molding resin 5 has a thermal conductivity greater than that of air, a greater amount of heat can be removed from the semiconductor chip 20 compared to the case where there is no encapsulation with molding resin. The heat removal is also improved by an increase in the contact area between the semiconductor chip 20 and the molding resin 5 due to the recesses 21 on the back surface of the semiconductor chip 20. Thus, embodiment 5 can provide better heat removal from a semiconductor device than embodiment 4.

EMBODIMENT 6

Figure 7:
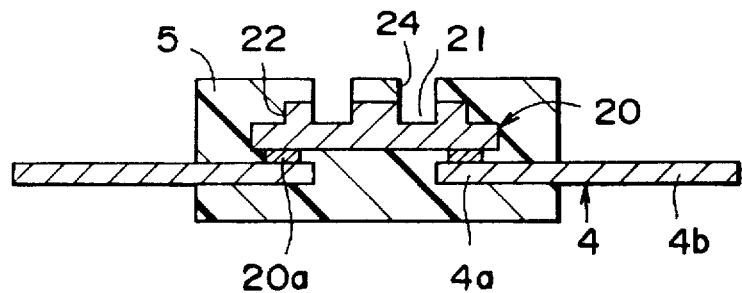
FIG. 7 is a cross-sectional view of a sixth embodiment of a semiconductor device according to the present invention.

FIG. 7 is a cross-sectional view of a semiconductor device according to embodiment 6 of the present invention. The semiconductor device according to embodiment 6 is configured in the same manner as in embodiment 5 except that there are provided cut-out portions 24 in the molding resin 5, through which recesses 21 on the back surface of a semiconductor chip 20 are exposed to the outside. In this embodiment 6, since the cut-out portions 24 are in the molding resin 5 so that the recesses 21 on the back surface of the semiconductor chip 20 are exposed directly to the outside, it is possible to supply cooling air or water to the recesses 21 so as to more effectively cool the semiconductor chip 20. In this structure, an electronic circuit of the semiconductor chip 20, connections to a lead frame 4, and other elements are still covered with the molding resin 5, and thus these portions are protected from being contaminated with dirt or moisture, and also protected from being damaged. Therefore, degradation in reliability or performance of the semiconductor device does not occur. While there are cut-out portions 24 in the molding resin 5, good enough adhesion between the semiconductor chip 20 and the molding resin 5 can be maintained via the step 22 and other portions. Furthermore, even in the case where cooling air or water is not supplied to the recesses 21, the structure having the recesses 21 according to embodiment 6 can provide heat removal which is equal to or better than that in embodiment 4.

EMBODIMENT 7

Figure 8:
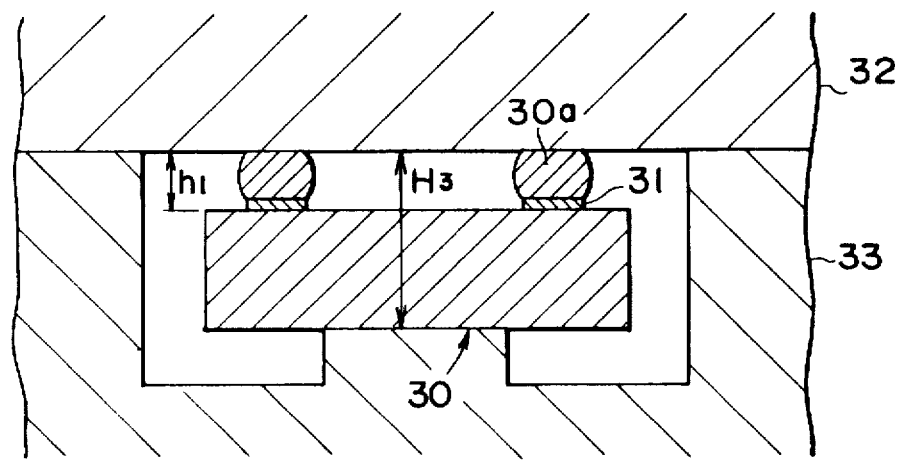
FIG. 8 is a cross-sectional view illustrating a method of producing a semiconductor device according to a seventh embodiment of the present invention.
Figure 9:
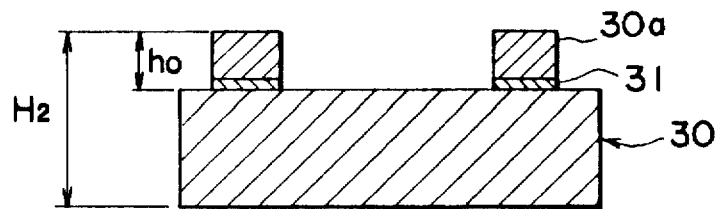
FIG. 9 is a cross-sectional view of a semiconductor chip for use in a method of producing a semiconductor device according to the seventh embodiment of the present invention.

FIG. 8 is a cross-sectional view illustrating a method of producing a semiconductor device according to embodiment 7 of the present invention. In this embodiment 7, a semiconductor device is produced as follows. A semiconductor chip 30 having electrodes 31 and bumps 30a is clamped by an upper die 32 and a lower die 32. A molding resin 5 is then injected and cured. The height $H_3$ (refer to FIG. 8) of a cavity between the upper die 32 and the lower die 33 is smaller than the height $H_2$ (refer to FIG. 9) by 1 μm to 10 μm so as to ensure that the semiconductor chip 30 having the electrodes 31 and the bumps 30a is clamped by the upper die 32 and the lower die 33. That is, the bumps 30a are compressed by the upper and lower dies 32 and 33, and the bumps 30a are deformed, whereby the bumps 30a are in perfect contact with the upper die 32. In this state, if the molding resin 5 is injected into the cavity, a semiconductor device shown in FIG. 10 can be obtained without producing any thin burrs 9 of the molding resin 5 on the surfaces of the bumps 30a, since there are no gaps between the upper surfaces of the bumps 30a and the lower surface of the upper die 32.

The amount of the compression of the bump due to the clamping by the upper and lower dies 32 and 33 can be defined as the difference between the original height $h_0$ of the bump 30a and the height $h_1$ of the bump 30a after being compressed, that is, $\Delta h = h_0 - h_1$. The compression stress $\sigma$ which occurs in the bump 30a when the bump 30a is compressed by the upper and lower dies 32, 33 to the height $h_1$, can be written as $\sigma = (\Delta h / h_0)E$ where E is the longitudinal elastic modulus which depends on the material of the bump. In the above equation, both $\Delta h$ and $h_0$ can be determined taking into account the dimensional tolerance of the semiconductor chip 30. This means that it is possible to control the magnitude of the compression stress $\sigma$ so that the bump 30a is not destroyed by too large a compression stress $\sigma$ exerted by the upper and lower dies 32 and 33. In the above example, the amount of the compression $\Delta h$ is assumed to be in the range from 1 μm to 10 μm. However, $\Delta h$ may have another value as long as the compression stress $\sigma$ is in the allowable range.

In this embodiment 7, as described above, the height of the cavity between the upper die 32 and the lower die 33 is smaller than the height including the bump 30a to ensure that the upper surface of the bump 30a is in good contact with the inner face of the upper die 32. Therefore, when the molding resin 5 is injected into the cavity and cured, no thin burrs 9 are produced on the upper surface of the bumps 30a. Thus, the semiconductor device according to this embodiment 7 can be easily mounted without a process for removing the thin burrs 9.

EMBODIMENT 8

Figure 10:
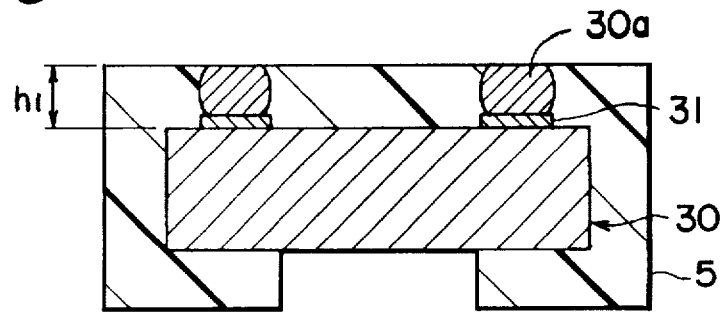
FIG. 10 is a cross-sectional view of a semiconductor device produced by a method according to the seventh embodiment of the present invention.
Figure 11:
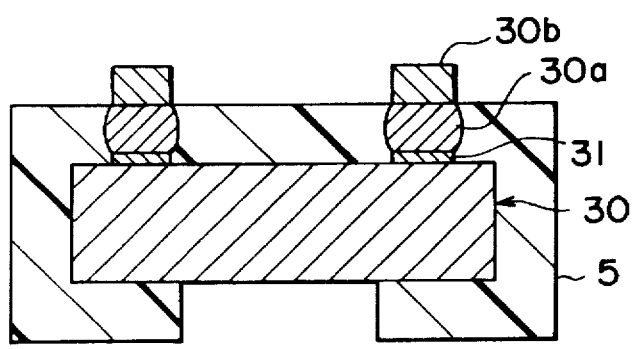
FIG. 11 is a cross-sectional view of a semiconductor device produced by a method of producing a semiconductor device according to an eighth embodiment of the present invention.
Figure 12:
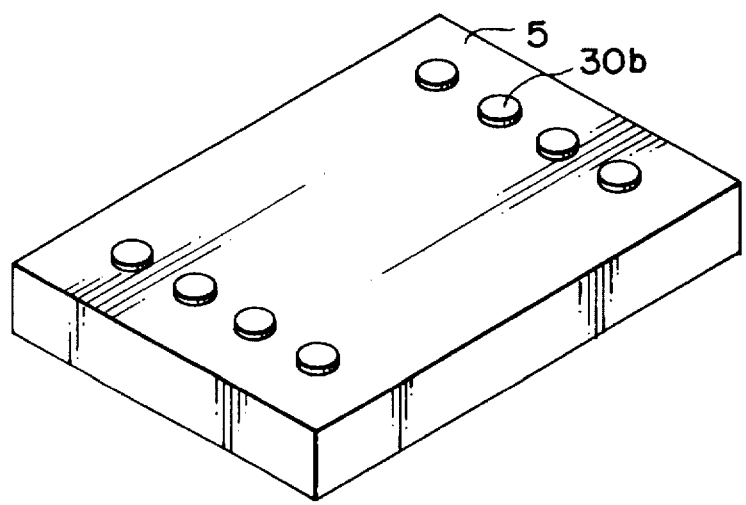
FIG. 12 is a perspective view of the semiconductor device produced by a method according to the eighth embodiment of the present invention.

In embodiment 7 described above, the upper surfaces of the bumps 30a and the surface of the molding resin 5 lie in the same plane as shown in FIG. 10. In embodiment 8, however, after producing a semiconductor device in the same manner as that in embodiment 7, additional bumps 30b are formed on the bumps 30a so that the bumps 30b protrude from the surface of the molding resin 5 as shown in FIG. 11 (refer also to FIG. 12).

In this embodiment 8, since there are provided bumps 30b protruding from the surface of the molding resin 5, the semiconductor device can be easily mounted on a circuit board.

EMBODIMENT 9

Figure 13:
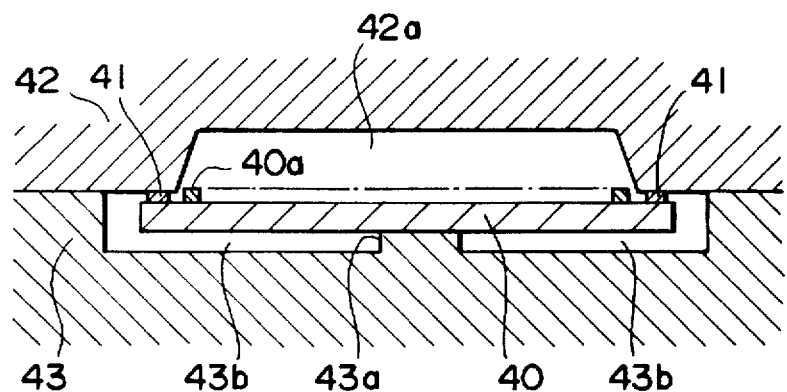
FIG. 13 is a cross-sectional view illustrating a method of producing a semiconductor device according to a ninth embodiment of the present invention.
Figure 14:
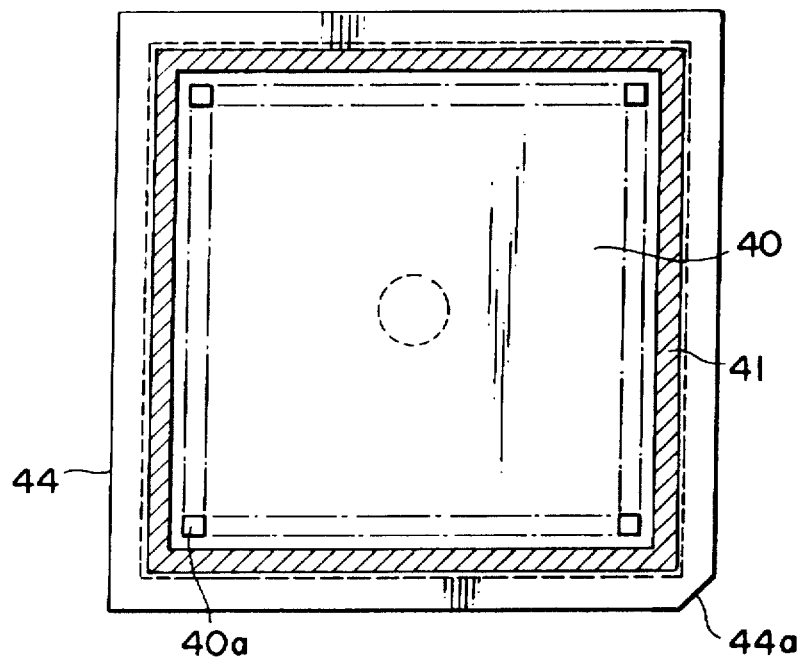
FIG. 14 is a plan view of a semiconductor device produced by a method of producing a semiconductor device according to the ninth embodiment of the present invention.
Figure 15:
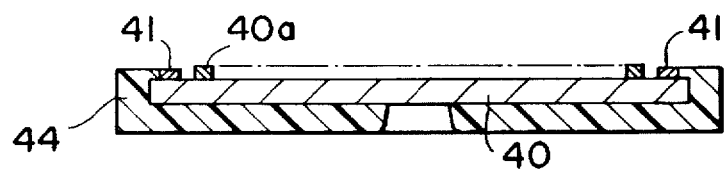
FIG. 15 is a cross-sectional view of the semiconductor device produced by a method of producing a semiconductor device according to the ninth embodiment of the present invention.

FIG. 13 is a cross-sectional view illustrating a molding process relating to a method of producing a semiconductor device according to embodiment 9 of the present invention. FIG. 14 is a plan view of a semiconductor device produced according to the method shown in FIG. 13. FIG. 15 is a cross-sectional view of the semiconductor device shown in FIG. 14.

As shown in these figures, there is provided a dam 41 extending continuously in a peripheral area on a semiconductor chip 40 around i.e., out-side, bumps 40a. In the example shown in these figures, the height of the bump 40a is greater than that of the dam 41.

Now, a method of producing a semiconductor device according to embodiment 9 will be described. First, a semiconductor chip 40 is placed in a cavity between an upper die 42 and a lower die 43 so that the back surface of the semiconductor chip 40 is in contact with a holding protrusion 43a on the lower die 43, and the dam 41 is pressed by the upper die 42 whereby the semiconductor chip 40 is held between the dies 42 and 43. A molding resin 44 such as an epoxy resin is then injected into a space 43b between the semiconductor chip 40 and the lower die 43.

Since the dam 41 is in contact with the upper die 42, the space 42a between the semiconductor chip 40 and the upper die 42 is isolated from the other portions. Therefore, the molding resin 44 does not intrude into the space 42a. While some thin burrs 9 may be formed between the upper surface of the dam 41 and the upper die 42, no burrs are produced on the upper surfaces of the bumps 40a. Therefore, the upper surfaces of the bumps 40a are kept clean.

In this embodiment, as described above, since the molding is performed on a semiconductor chip 40 having a dam 41, the semiconductor chip 40 can be encapsulated with a molding resin 44 so as to enhance the mechanical strength of the semiconductor chip 40 without embedding bumps 40a in the molding resin 44.

It is preferable that the width of the dam 41 be greater than 50 μm. In this molding method, the height of the dam 41 relative to the surface of the semiconductor chip 40 may be either equal to or smaller than the height of the bump 40a. In both cases, the surfaces of the bumps 40a are not damaged and are kept clean unless the upper surfaces of the bumps 40a is in contact with the upper die 42. An injection inlet for the molding resin 44 may be formed at a desired arbitrary location, which provides a high degree of freedom in design. Furthermore, the molding resin 44 may be designed to have a desired arbitrary outer shape.

In this embodiment 9, since the semiconductor chip 40 is held with the lower die 43 in contact with the back surface of the semiconductor chip 40 and with the upper die 42 in contact with the dam 41, large dimensional tolerances are allowable for the dimensions of the semiconductor chip 40 and the dam 41, if the thickness of the dam 41 is designed properly. Thus, it is possible to achieve high productivity in production of the molded semiconductor device having bumps.

EMBODIMENT 10

Figure 16:
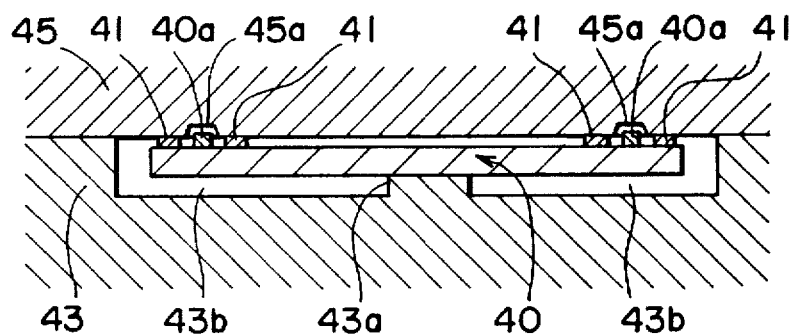
FIG. 16 is a cross-sectional view illustrating a method of producing a semiconductor device according to a tenth embodiment of the present invention.
Figure 17:
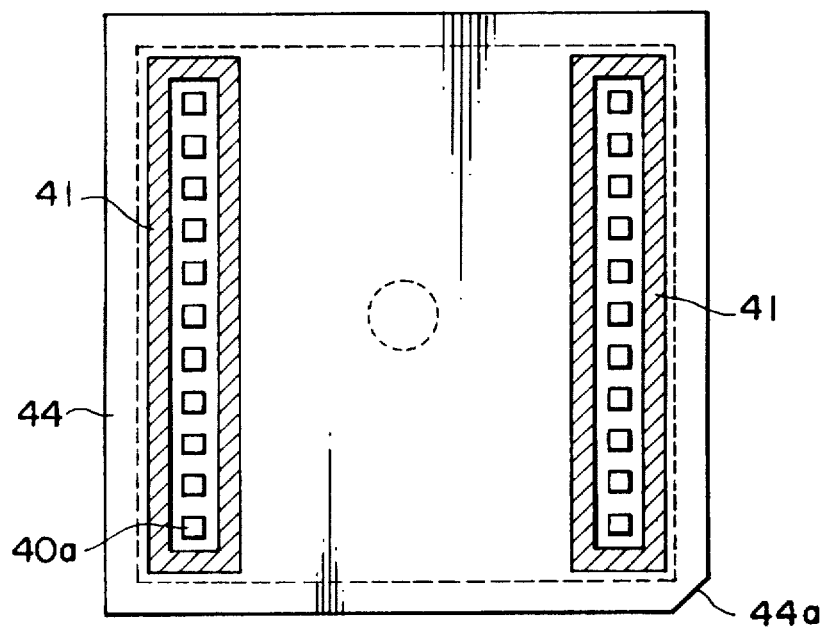
FIG. 17 is a plan view of a semiconductor device produced by a method of producing a semiconductor device according to the tenth embodiment of the present invention.
Figure 18:
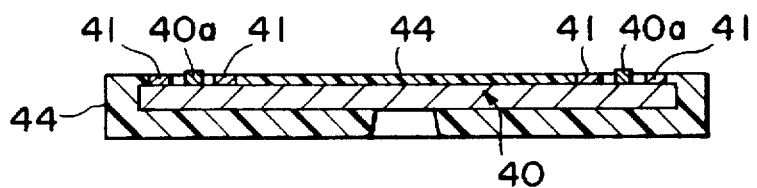
FIG. 18 is a cross-sectional view of a semiconductor device produced by a method of producing a semiconductor device according to the tenth embodiment of the present invention.

FIG. 16 is a cross-sectional view illustrating a molding process relating to a method of producing a semiconductor device according to embodiment 10 of the present invention. FIG. 17 is a plan view of a semiconductor device produced according to the method shown in FIG. 16. FIG. 18 is a cross-sectional view of the semiconductor device shown in FIG. 17. In this embodiment 10, bumps 40a are located along two opposing sides of a semiconductor chip 40, and there is provided a dam 41 extending continuously in a peripheral area on a semiconductor chip 40 around bumps 40a. As shown in FIG. 16, recesses 45b are present in an upper die 45 at locations corresponding to the bump area, and the dam 41 is pressed by the upper die 42 so that the entire semiconductor chip 44 may be protected with a molding resin 44 except the regions inside dams 41 surrounding the bumps 40a.

EMBODIMENT 11

Figure 19:
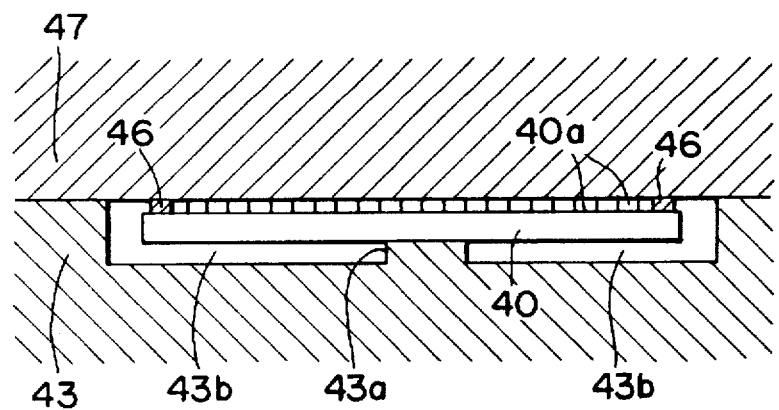
FIG. 19 is a cross-sectional view illustrating a method of producing a semiconductor device according to an eleventh embodiment of the present invention.
Figure 20:
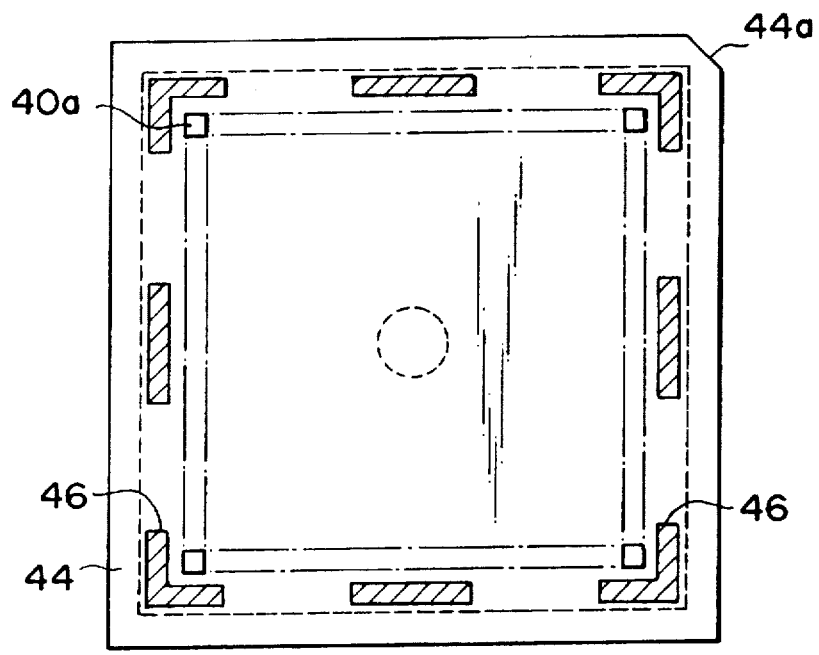
FIG. 20 is a plan view of a semiconductor device produced by a method of producing a semiconductor device according to the eleventh embodiment of the present invention.
Figure 21:
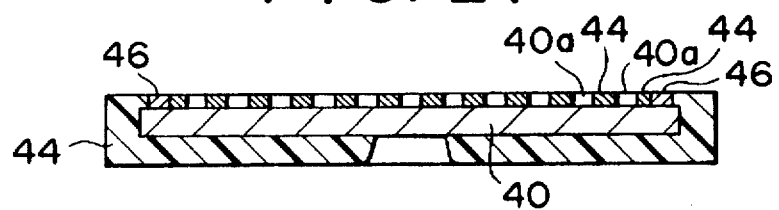
FIG. 21 is a cross-sectional view of a semiconductor device produced by a method of producing a semiconductor device according to the eleventh embodiment of the present invention.

FIG. 19 is a cross-sectional view illustrating a molding process relating to a method of producing a semiconductor device according to embodiment 11 of the present invention. FIG. 20 is a plan view of a semiconductor device produced according to the method shown in FIG. 19. FIG. 21 is a cross-sectional view of the semiconductor device shown in FIG. 20. In this embodiment 11, discontinuous dams 46 are located on a semiconductor chip 40 in a peripheral area around bumps 40a. The height of the dam 46 is equal to that of the bump 40a. The upper die 47 has a flat inner face facing the lower die 43 so that the flat inner face may be in contact with the upper faces of the bumps 40a and the upper faces of the dams 46.

In this embodiment 11, the semiconductor chip 40 is held with the lower die 43 in contact with the back surface of the semiconductor chip 40 and with the upper die 47 pressing the upper surfaces of the bumps 40a and the dams 46 located in the partial areas on the semiconductor chip 40. Since the height of the bump 40a is equal to the height of the dam 46 relative to the surface of the semiconductor chip 40, the dams 46 receive a great part of the pressing force exerted by the upper die 47, while the bumps 40a are in good contact with the upper die 47 without gaps. Thus, when the molding resin 44 is injected so as to encapsulated the semiconductor chip 40, no thin burrs 9 are formed on the surfaces of the bumps 40a. Therefore, a process step for removing burrs after the molding is not required, and thus the surfaces of the bumps 40a are not damaged, which might occur if the burr removal process is performed. The production method according to embodiment 11 provides high productivity, high quality, and low cost in production of a molded semiconductor device having bumps with clean surfaces.

EMBODIMENT 12

Figure 22:
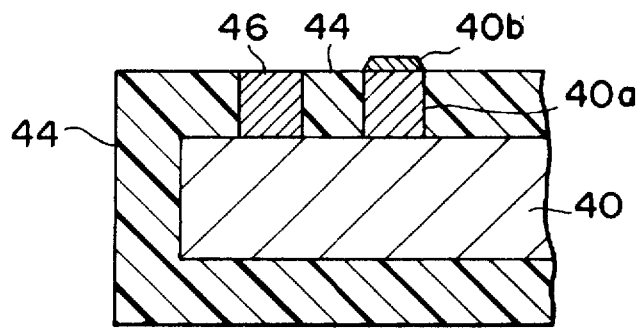
FIG. 22 is a cross-sectional view illustrating a method of producing a semiconductor device according to a twelfth embodiment of the present invention.
Figure 23:
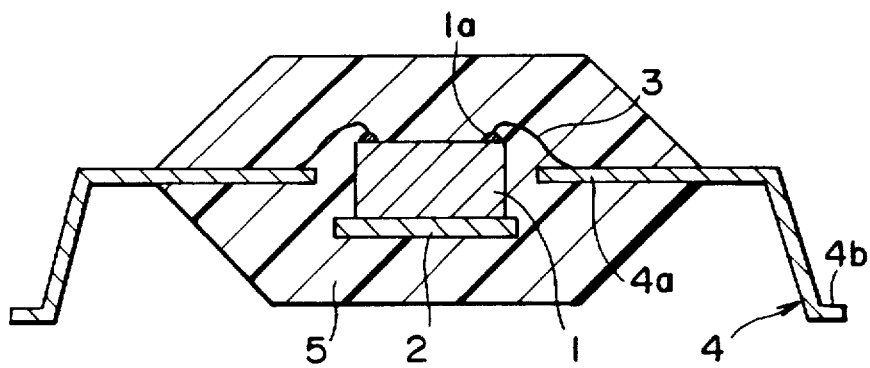
FIG. 23 is a cross-sectional view of a conventional semiconductor device.
Figure 24:
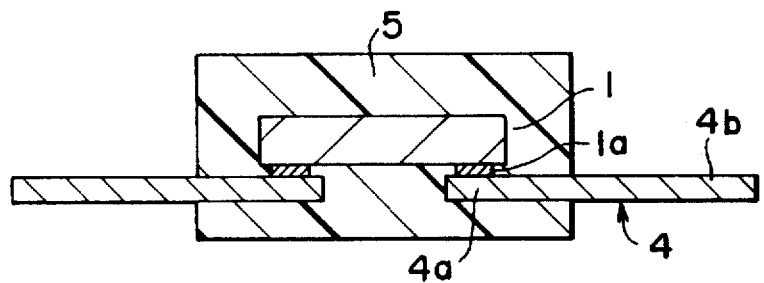
FIG. 24 is a cross-sectional view of another conventional semiconductor device.
Figure 25:
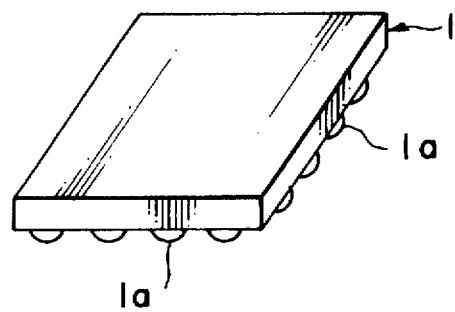
FIG. 25 is a perspective view of the conventional semiconductor device.
Figure 26:
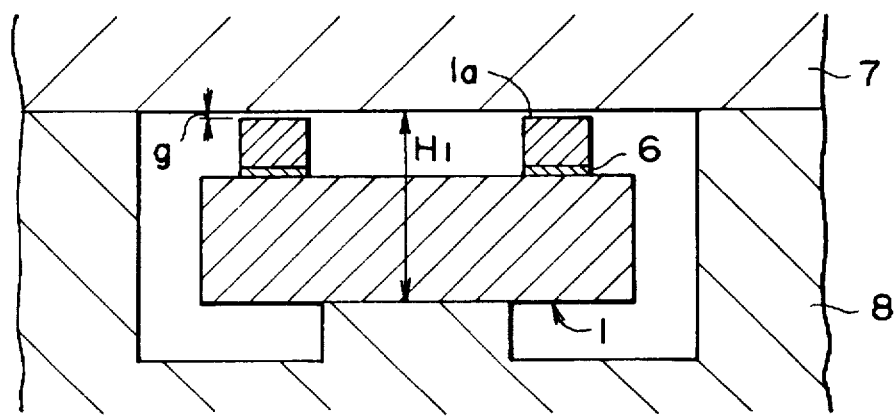
FIG. 26 is a cross-sectional view illustrating a method of producing a semiconductor device according to a conventional technique.
Figure 27:
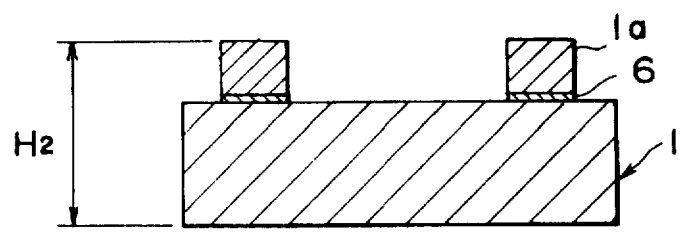
FIG. 27 is a cross-sectional view of a semiconductor chip for use in the method of producing a semiconductor device according to the conventional technique.
Figure 28:
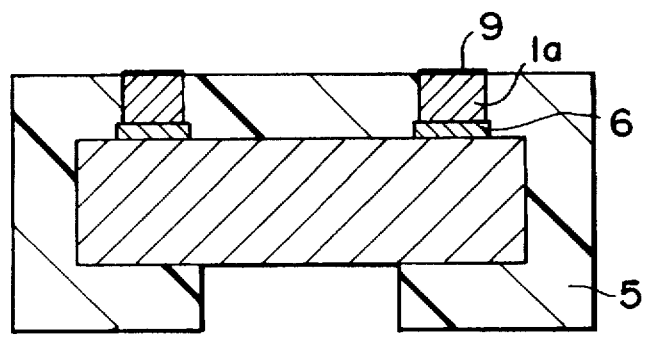
FIG. 28 is a cross-sectional view of a semiconductor device produced by the method of producing a semiconductor device according to the conventional technique.
Figure 29:
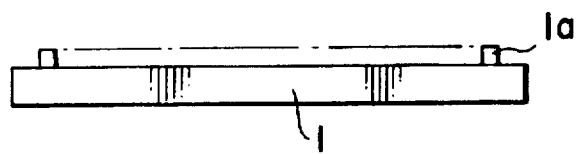
FIG. 29 is a cross-sectional view of another conventional semiconductor device.

FIG. 22 is a cross-sectional view illustrating major portions of a semiconductor device produced by a method according to embodiment 12 of the present invention. In embodiment 12, after producing a semiconductor device in the same manner as that in embodiment 11, an additional bump 40b is formed on the top of each bump 40a exposed from the molding resin 44 to the outside. In embodiment 11 described above, the height of the bumps 40a is equal to the height of the dam 46 relative to the surface of the semiconductor chip 40. Therefore, the surfaces of the bumps 40a are sometimes damaged when the bumps 40a are pressed by the upper die 47. To solve this problem, in embodiment 12, an additional bump 40b is formed on the surface of each bump 40a after the completion of the molding process so that clean surfaces of the additional bumps 40b may be used as connection surfaces. The additional bumps are not required if the inner surface of the upper die 47 is kept clean during the production of the semiconductor device.

There are no special restrictions in the number or the locations of the bumps 40a, and the dams 41 and 46 may be formed corresponding to the bumps 40a without limitation to the details shown in embodiments 9–12.

EMBODIMENT 13

In embodiment 13, when a semiconductor chip 40 is encapsulated with a molding resin 44 according to any method of embodiments 9–12, a cut-out portion 44a is formed in the molding resin 44 as shown in FIGS. 14, 17, and 20. The cut-out portion 44a can be easily formed if a portion (not shown) corresponding the cut-out portion 44a is provided the lower die.

It is possible to easily determine the upper and lower surfaces or right and left sides of the semiconductor chip 40 judging from the cut-out portion 44a, whereby the semiconductor device can be easily handled.

What is claimed is:

1. A method of producing a semiconductor device comprising:

placing a semiconductor chip having a bump electrode and a total thickness including a thickness of said semiconductor chip and a height of said bump electrode in a cavity between a plurality of dies, the cavity having, between said dies, a height smaller than the total thickness of said semiconductor chip and said bump electrode, said semiconductor chip and said bump electrode contacting respective inner surfaces of said dies; and injecting a molten resin into the cavity and curing said resin to encapsulate said semiconductor chip with said bump electrode exposed at and not covered by said resin.

2. The method of producing a semiconductor device according to claim 1 comprising, after curing said resin, applying an additional bump electrode to said bump electrode.

3. A method of producing a semiconductor device from a semiconductor chip having a continuous dam peripherally surrounding part of a surface of said semiconductor chip and a bump electrode on the surface of said semiconductor chip by placing said semiconductor chip in a cavity between a plurality of dies with said dam in contact with an inner surface of one of said dies, injecting a molten resin into the cavity, said dam preventing said molten resin from reaching part of the cavity, the part of the surface of said semiconductor chip, and said bump electrode, and curing said resin to partially encapsulate said semiconductor chip, the part of the surface and said bump electrode being exposed and not covered by said resin.

4. The method of producing a semiconductor device according to claim 3 wherein at least one of said dies has a cut-out forming portion thereby forming a cut-out portion in a part of an outer wall of said resin upon injecting and curing of said resin.

5. A method of producing a semiconductor device from a semiconductor chip having a discontinuous dam peripherally surrounding part of a surface of said semiconductor chip and a bump electrode on the surface of said semiconductor chip by placing said semiconductor chip in a cavity between a plurality of dies with said bump electrode and said dam in contact with an inner surface of one of said dies, injecting a molten resin into the cavity, and curing said resin to encapsulate said semiconductor chip with said bump electrode exposed from and not covered by said resin.

6. The method of producing a semiconductor device according to claim 5 wherein at least one of said dies has a cut-out forming portion thereby forming a cut-out portion in a part of an outer wall of said resin upon injecting and curing of said resin.

7. The method of producing a semiconductor device according to claim 5 including, after curing the resin, applying an additional bump electrode on said bump electrode.

* * * * *